United States Patent [19]

Holmes et al.

[11] Patent Number: 4,627,009
[45] Date of Patent: Dec. 2, 1986

[54] MICROSCOPE STAGE ASSEMBLY AND CONTROL SYSTEM

[75] Inventors: Duane C. Holmes, San Jose; Guillermo L. Toro-Lira, Mountain View, both of Calif.

[73] Assignee: Nanometrics Inc., Sunnyvale, Calif.

[21] Appl. No.: 497,517

[22] Filed: May 24, 1983

[51] Int. Cl.[4] ................. G06F 15/46; G05B 19/19
[52] U.S. Cl. ..................... 364/559; 250/442.1; 318/640; 350/531; 364/167; 364/183
[58] Field of Search ............... 364/182, 190, 559, 513, 364/167, 183; 350/529, 530, 531, 532, 534; 318/561, 640, 625; 250/442.1, 311

[56] References Cited

U.S. PATENT DOCUMENTS

| | | | |
|---|---|---|---|
| 3,778,621 | 12/1973 | Mikajiri | 250/442.1 |
| 3,826,558 | 7/1974 | Rasberry et al. | 350/531 |
| 3,952,203 | 4/1976 | Hoppe | 250/311 |
| 3,997,807 | 12/1976 | Riddle et al. | 250/311 |
| 4,087,729 | 5/1978 | Yamazaki et al. | 318/640 |
| 4,203,064 | 5/1980 | Suzuki et al. | 364/559 |
| 4,305,130 | 12/1981 | Kelley et al. | 318/640 |
| 4,328,553 | 5/1982 | Fredriksen et al. | 364/559 |
| 4,413,186 | 11/1983 | Uema | 364/559 |
| 4,425,507 | 1/1984 | Panov et al. | 250/442.1 |
| 4,481,569 | 11/1984 | Hoodbhoy | 364/183 |

OTHER PUBLICATIONS

Gunn et al.: A Versatile Patient Positioner for Radiation Therapy. IEEE Conference, Transactions Nuclear Science, vol. NS-20, No. 3, Jun. 1973.

Primary Examiner—Felix D. Gruber
Attorney, Agent, or Firm—Linval B. Castle; Paul L. Hickman

[57] ABSTRACT

A computerized stage assembly for a Scanning Electron Microscope including a support frame, a tilt frame pivotally coupled to the support frame, an X carriage engaged with the tilt frame for movement in an X direction, a Y carriage engaged with the X carriage for movement in a Y direction, and a pedestal carried by the Y carriage and capable of rotation around an axis substantially normal to both the X and Y directions. The tilt frame, X and Y carriages, and pedestal are moved by computer controlled step motors. The tilting and rotating of a specimen secured to the pedestal is non-eucentric, i.e. the axis of rotation or tilt is not necessarily through the point of inspection on the specimen. A method is disclosed for automatically returning an inspection point to the viewing field of the microscope after a non-eucentric rotation or tilt.

7 Claims, 8 Drawing Figures

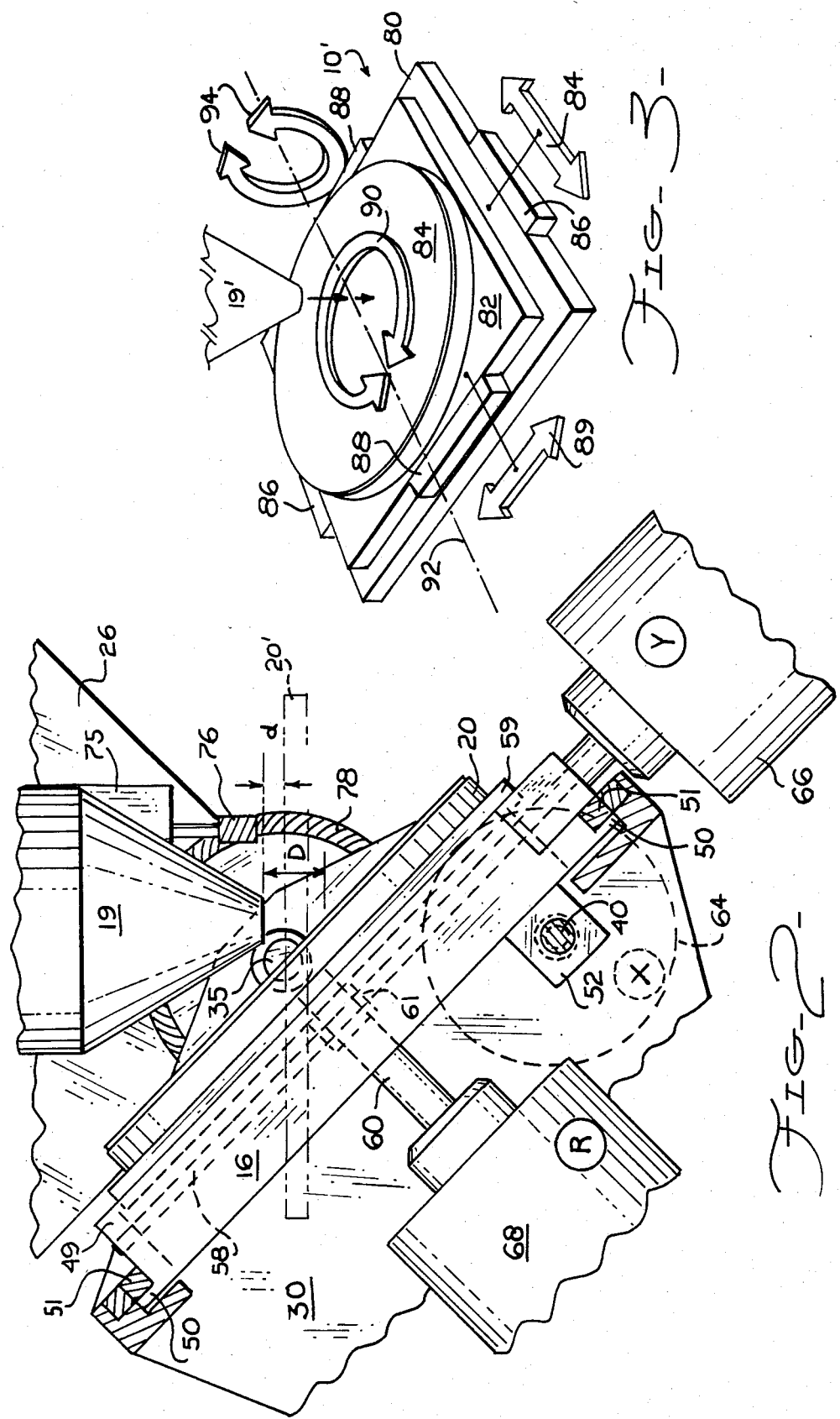

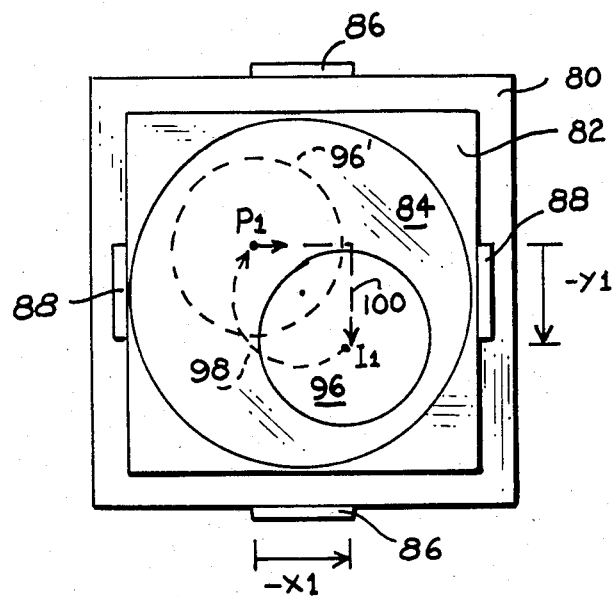
FIG-4-
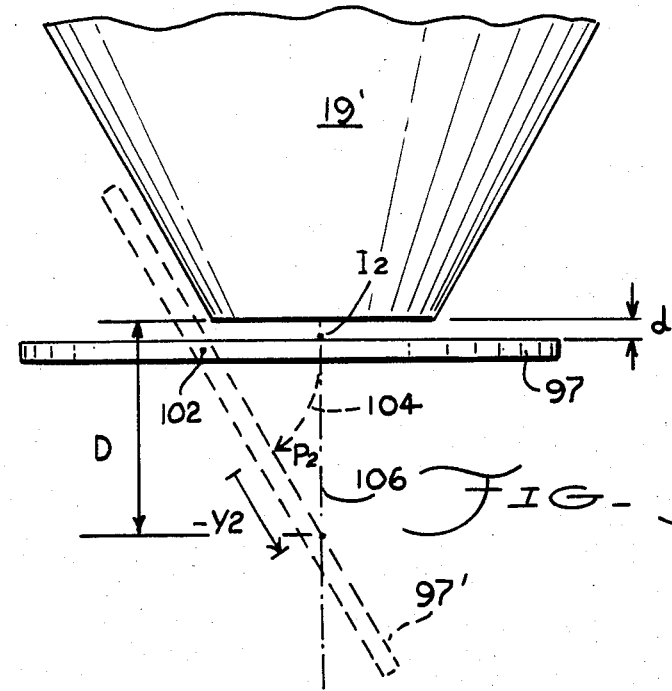
FIG-5-

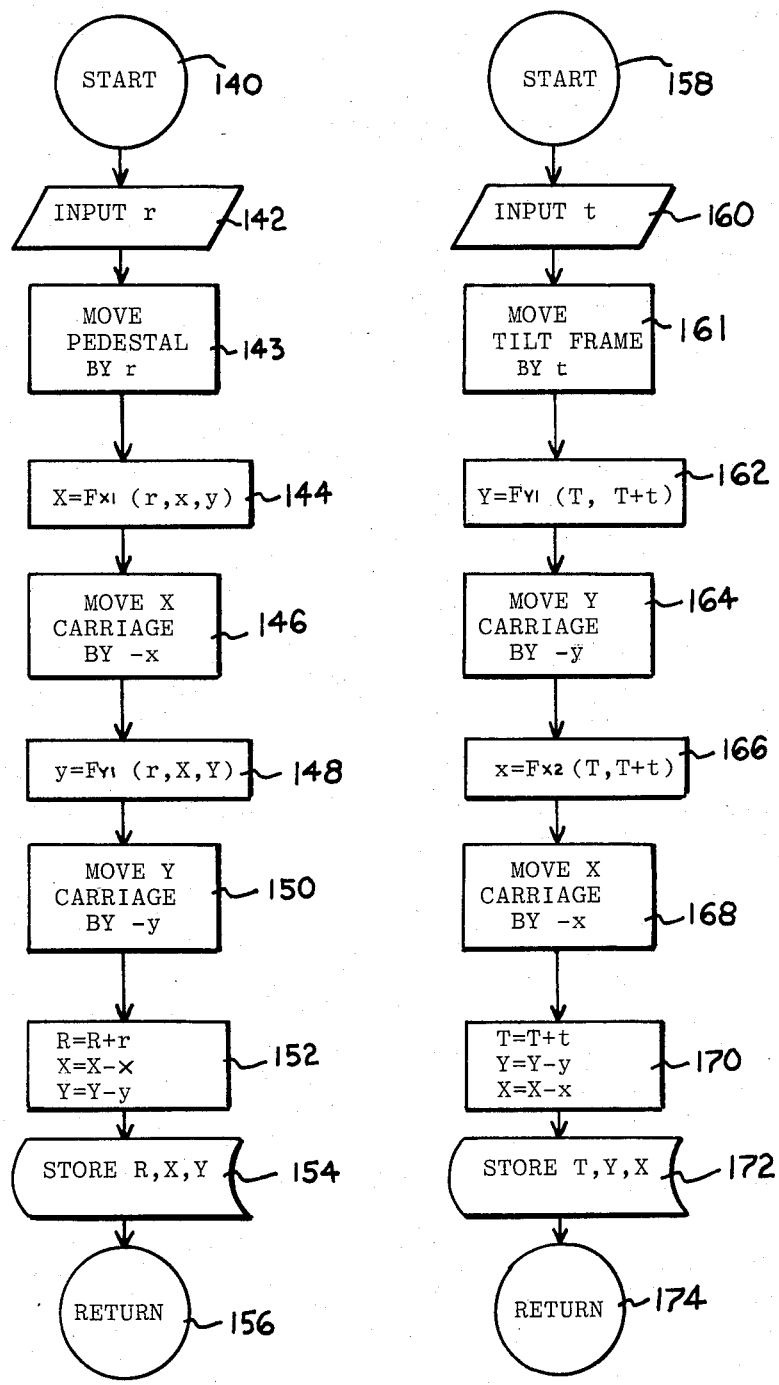
FIG-7a- FIG-7b-

MICROSCOPE STAGE ASSEMBLY AND CONTROL SYSTEM

BACKGROUND OF THE INVENTION

1. Field of the Invention

This invention relates generally to microscope viewing stages and more particularly to adjustable viewing stages for particle beam or laser beam microscopes.

2. Description of the Prior Art

Semiconductor wafers can be viewed with Scanning Electron Microscopes to look for defects that might degrade or impair the functioning of integrated circuits made from the wafer. A Scanning Electron Microscope (SEM) sweeps a beam of electrons across the wafer which stimulates the emission of secondary electrons from the wafer surface. The secondary electrons are detected to develop an image of the surface of the wafer on a Cathode Ray Tube (CRT) monitor. Unlike optical microscopes, the electron microscope has electrically controlled, variable focus lenses and thus the distance between the specimen and the objective lens can vary.

In the past, wafers have been primarily inspected from a plan view substantially normal to the plane of the wafer. Unfortunately, a plan view of the wafer does not allow an operator to properly view undercuts and other features hidden from a vertical view.

A solution to this problem, addressed in an abandoned copending application Ser. No. 491,516, filed May 24, 1983 allowed the wafer to be tilted and rotated relative the lens so that an operator can see oblique elevational views of the wafer's surface. If the wafer is rotated or tilted eucentrically around the inspection point on the wafer (i.e. the axis of rotation or tilt passes through the inspection point), the inspection point will remain in the field of view and the focus will be maintained. On the other hand, if the wafer is rotated or tilted non-eucentrically (i.e. the axis of rotation or tilt does not pass through the inspection point), the inspection point will no longer be within the field of view.

Stage assemblies capable of eucentric rotation and tilt tend to be more complex mechanically and thus more expensive than stage assemblies that rotate or tilt non-eucentrically. For example, a stage assembly capable of eucentric tilt needs to be able to move in X, Y, T, and Z directions to minimize working distances at any given tilt angle. On the other hand, a non-eucentric stage assembly needs only to move in the X, Y, and T directions to minimize working distances, and thus eliminates the cost of Z direction adjustment mechanisms and controllers. Furthermore, the rotation mechanism of eucentric stage assemblies are complicated by the fact that they must be capable of rotating an entire X and Y carriage assembly rather than just a wafer pedestal, as is the case with a non-eucentric stage assembly.

SUMMARY OF THE INVENTION

The major object of this invention is to provide a stage assembly which allows a specimen to be mechanically rotated and/or tilted in a non-eucentric manner, and a controller which compensates for the tilt or rotation to return the inspection point to the field of view.

Briefly, the invention includes a support frame, a tilt frame pivotally supported by the support frame, an X carriage guided for linear motion in an X direction by the tilt frame, a Y carriage guided for linear motion in a Y direction by the X carriage, and a pedestal supported by the Y carriage for rotation about an axis normal to both the X and Y directions. The tilt frame, X carriage, Y carriage, and pedestal are independently adjustable with step motors.

A controller including a CPU, RAM, PROM, EEPROM, I/O ports, and drivers control the actions of the step motors. The method steps performed by the CPU essentially consist of: (1) inputting the rotation or tilt desired by the operator; (2) non-eucentrically rotating or tilting the stage accordingly; (3) calculating x and y correction factors to bring the inspection point back into viewing position; and (4) moving the X carriage by -x and moving the Y carriage by -y.

An advantage of this invention is that it is mechanically less complex than a eucentric stage assembly of comparable capabilities, and thus is more efficient, economical and reliable.

Another advantage of this invention is that the inspection point is automatically returned to the field of view after a non-eucentric rotation or tilt, which makes the apparatus much easier to use for an operator.

These and other objects and advantages of the present invention will no doubt become apparent upon a reading of the following descriptions and a study of the several figures of the drawing.

BRIEF DESCRIPTION OF THE DRAWING

FIG. 2 is a partial side elevational view of the stage assembly and lens shown in FIG. 1;

FIG. 3 is a pictorial, perspective representation showing the directions of movement of the various parts of the stage assembly;

FIG. 4 is a top plan view of the pictorial representation of FIG. 3 illustrating a rotation of the stage assembly's pedestal;

FIG. 5 is a pictorial, elevational representation illustrating a tilt of the stage assembly;

FIG. 7a is a flow chart of the steps involved in controlling a rotation of the stage assembly's pedestal; and FIG. 7b is a flow chart of the steps involved in controlling a tilt of the stage assembly.

DETAILED DESCRIPTION OF THE PREFERRED EMBODIMENT(S)

Figure 1:
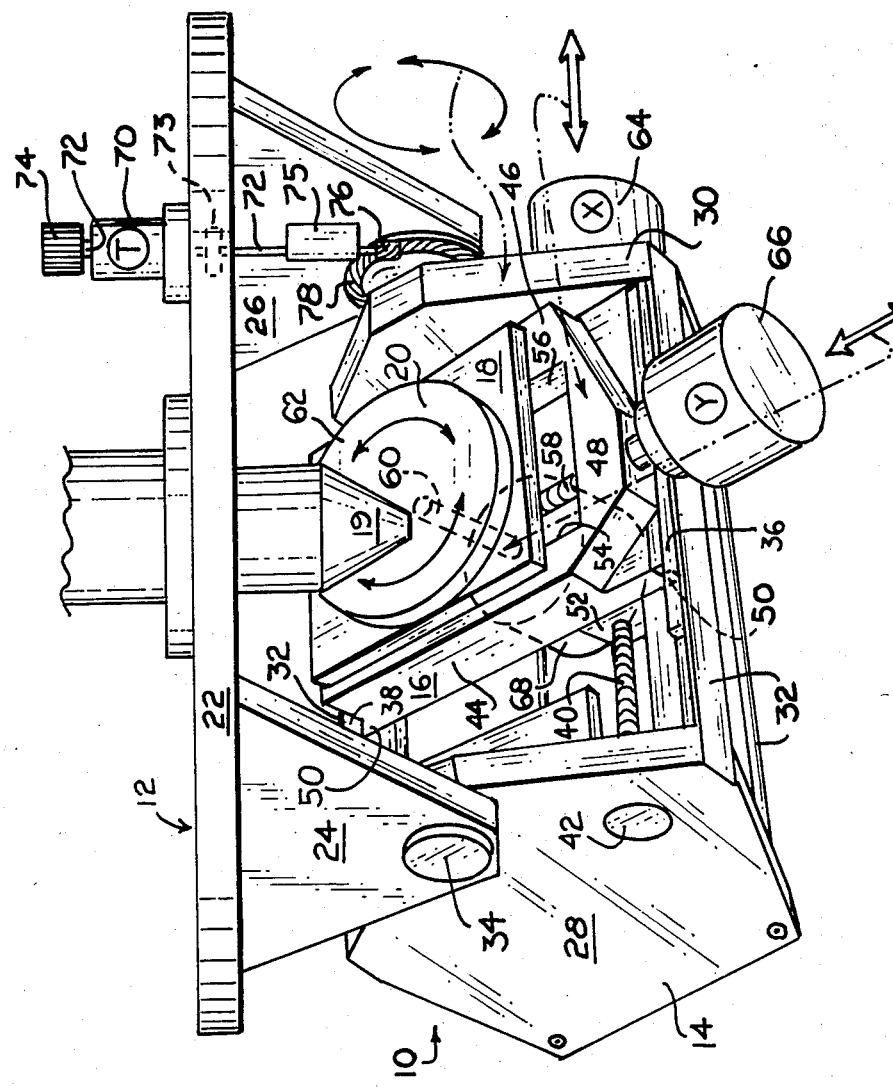
FIG. 1 is a perspective view of the stage assembly and lens of the present invention.

Referring to FIGS. 1 and 2, a stage assembly 10 in accordance with the present invention includes a support frame 12, a tilt frame 14, a first or "X" carriage 16, a second or "Y" carriage 18, and a pedestal 20. A truncated, conical, magnetic lens 19 is supported by frame 12 in proximity to pedestal 20.

Support frame 12 includes a substantially horizontal base member 22, and a pair of downwardly extending legs 24 and 26. The legs 24/26 are provided with bores at their lower extremities which, as will be discussed later, are receptive to pivot members.

Tilt frame 14 has a pair of side frame members 28 and 30 that are connected together with a number of cross members 32. The side frame members 28/30 are substantially pentagonal in shape, and are provided with bore holes near their apex. Pivot members 34 and 35 engage the bores provided in leg members 24/26 and side frame members 28/30, respectively, to allow tilt frame 14 to tilt relative the support frame 12.

Tilt frame 14 is also provided with a first or "X" linear guide comprising tracks 36 and 38. A drive screw 40 extends between side frame members 28 and 30 and is supported for rotation by bearing packs such as bearing pack 42. The axis of rotation of drive screw 40 is parallel to linear guide tracks 36 and 38.

X carriage 16 includes a pair of side frame members 44 and 46 connected by cross members 48 and 49. Extensions 50 of side frame members 44/46 engage tracks 36/38 of the tilt frame 14 such that X carriage 16 is guided for bidirectional, linear motion parallel to tracks 36/38. Retainer members 51 secure the X carriage to the tracks 36/38.

X carriage 16 is provided with a pair of downwardly extending ears 52 having threaded bores receptive to drive screw 40. Thus, rotation of drive screw 40 will cause the X carriage to move along tracks 36/38.

The X carriage 16 is also provided with a pair of guide surfaces 54 and 56 which are substantially perpendicular to tracks 36/38. A drive screw 58 extends between cross members 48 substantially parallel to guide surfaces 54/56. The drive screw 58 is supported for rotation around its axis, and is offset from the center of the X carriage.

Y carriage 18 is square and planar and includes downwardly extending followers 59 which engage guide surface 54/56 of the X carriage. Thus, the Y carriage is guided for bidirectional, linear motion substantially perpendicular to the directions of motion of the X carriage. The combined motions of the X carriage and the Y carriage cause the Y carriage to move about in a Cartesian plane.

Y carriage 18 also includes a downwardly extending ear 61 having a threaded bore receptive to drive screw 58. Rotation of the drive screw 58 will cause the Y carriage to move in a direction parallel to guide surfaces 54/56.

Pedestal 20 sits on top of Y carriage 18 and is supported for rotation by a shaft 60 which extends through a bore provided through the center of the Y carriage 18. The axis of rotation of shaft 60 is normal to the axes of rotation of drive screws 40 and 58 so that the upper or specimen surface 62 of pedestal 20 rotates within a plane that is substantially parallel to the Cartesian plane described earlier.

The movement of the stage assembly 10 is accomplished with four, high speed step motors 64, 66, 68, and 70. All of the step motors are actually the size of the step motor 70, but step motors 64-68 are encased within large, cylindrical pressure housings to prevent the motors from contaminating the vacuum within the SEM. Step motor 70 is not exposed to the vacuum and thus does not need the pressure housing.

Step motor 64 is known as the "X" step motor and has its shaft attached to drive screw 40. Likewise, step motor 66 is known as the "Y" step motor and has its shaft attached to drive screw 58. The "R" step motor 68 rotates the shaft 60 that is attached to pedestal 20.

Step motor 70 is the "T" step motor and has its casing attached to base member 22 of the support frame 12. The shaft 72 of the T step motor extends from both ends of its casing, and is attached at an upper end to a manual adjustment knob 74. The other end of shaft 72 extends through a vacuum seal 73 in base member 22, a bearing assembly 75 which is attached to leg 26, and into a worm gear 76. A plate gear 78 is attached to the pivot 35 which couples leg 26 of support frame 12 to side frame member 30 of tilt frame 14. Worm gear 76 engages the gear teeth of plate gear 78 such that rotation of shaft 72 causes the tilt frame 14 to make a pivotal tilt around pivot members 34 and 35.

Each of step motors 66-70 are independently controllable by a control system to be discussed subsequently. The step motors permit very precise adjustment of the position of specimen surface 62. For example, with the step motors currently being used, one step of the motor causes a 0.01° shaft rotation which, in the case of the X and Y step motors, cause a 0.08 micron movement of the X or Y carriages, respectively.

Referring now to the pictorial representation of FIG. 3, a stage assembly 10' is located below a lens 19' and includes an X carriage 80, a Y carriage 82, and a pedestal 84. The X carriage 80 is guided for motion in the X direction by guides 86 as indicated by arrow 87, and the Y carriage 82 is supported by X carriage 80 and is guided for motion in the Y direction by guides 88, as indicated by arrow 89. Pedestal 84 is supported on Y carriage 82 for rotation around an axis substantially perpendicular to the Cartesian plane in which Y carriage 82 can move, as indicated by arrows 90. The entire assembly of X carriage 80, Y carriage 82, and pedestal 84 can be pivoted around a tilt axis 92, as indicated by arrows 94.

With reference to the top plan view of FIG. 4, a non-eucentric rotation of a wafer 96 will be described. The wafer 96 is secured to the specimen surface of pedestal 84 by techniques well known to those skilled in the art. The desired inspection point on wafer 96 is point $I_1$, which is directly below the opening of lens 19'. If the operator wishes to view inspection point $I_1$ from its opposite side, he instructs the control system to actuate the R step motor to make a non-eucentric, 180° rotation of the pedestal, repositioning wafer 96 at a new position 96'. The point on the wafer that was being inspected is rotated on a path 98 to a new position $P_1$ and thus is no longer underneath the opening of lens 19'. To move the desired inspection point back to the original position $I_1$, the X carriage 80 must be moved a distance-x1 and the Y carriage 82 must be moved a distance -y1 along a path 100.

In FIG. 5 a non-eucentric tilt of wafer 96 is shown. In its original position, wafer 97 is substantially horizontal and is separated from the opening of lens 19' by a small distance d. The point under inspection is labeled $I_2$. A non-eucentric tilt of wafer 97 around a pivot point 102 repositions wafer 97 at a new position 97'. The point that was under inspection moves along a path 104 to a new position $P_2$ which is no longer under the scanning electron beam 106 of the SEM. To bring the desired inspection point back beneath the beam 106, the wafer 97' is moved a distance -y2. A small adjustment of the wafer 97' can also be made in the X direction (which is perpendicular to the plane of the paper), if necessary.

It should be noted that the distance between lens 19' and the new inspection point $I_3$ has increased from "d" to "D" and thus reduces the resolution of the SEM. The increase in working distance under tilt conditions is also indicated in FIG. 2, where the pedestal is shown in a horizontal position in phantom at 20', and at a tilted position at 20. Thus, there the resolution of the SEM is inversely proportional to the degree of tilt of the wafer.

Figure 6:
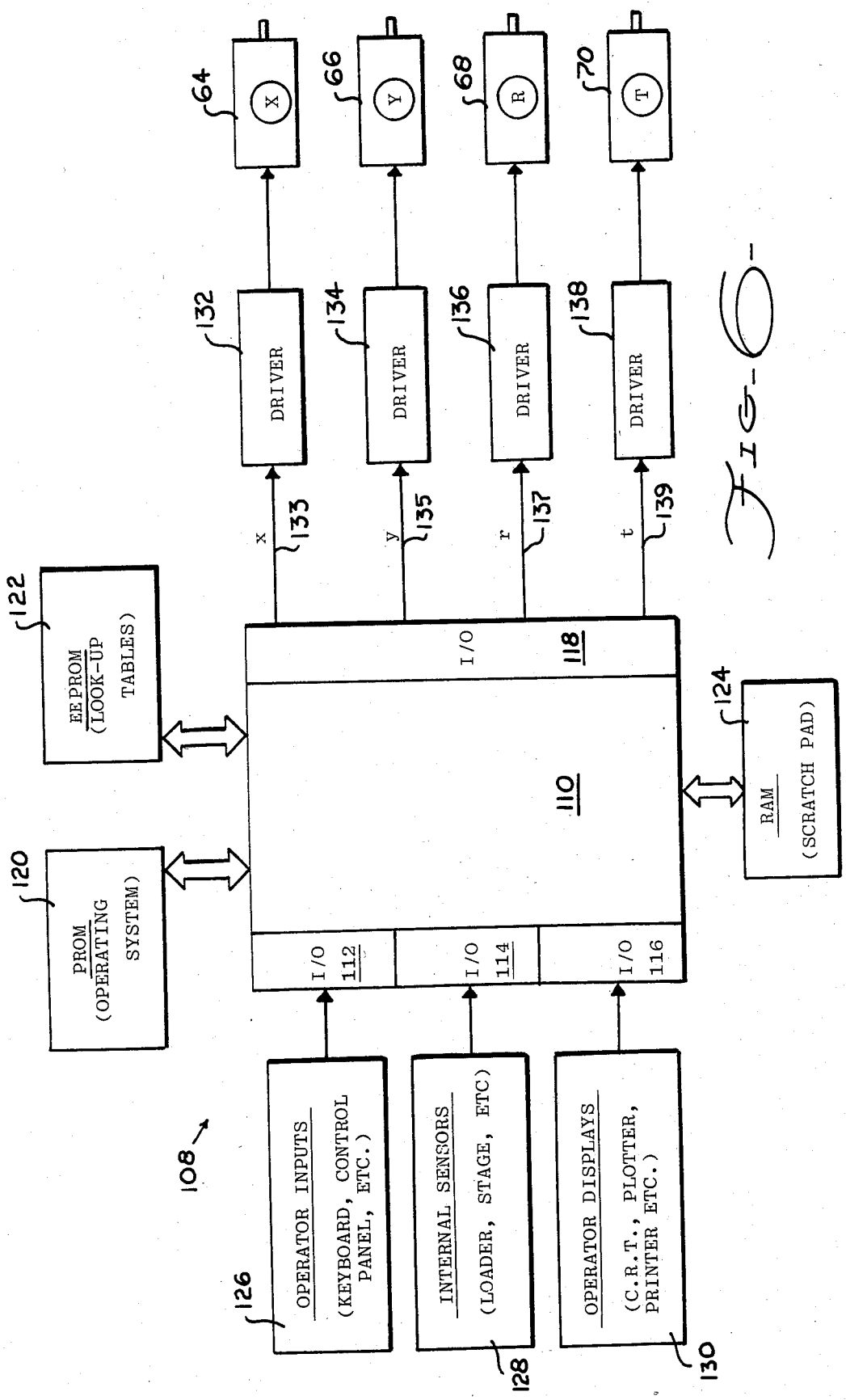
FIG. 6 is a block diagram of the control system for the stage assembly.

Referring now to FIG. 6, a control system 108 for the stage assembly 10 is shown to include a Central Processing Unit (CPU) 110, and a plurality of Input/Output ports (I/O) 112, 114, 116, and 118. The CPU 110 of the present embodiment is a 16 bit processor with an 8 bit bus, such as the Intel 8088 microprocessor. The I/O ports are primarily of conventional design, such as RS-232c serial interfaces.

CPU 110 is coupled to a Programmable Read-Only Memory (PROM) bank 120, which stores the basic operating system of the control system 108, and to an Electrically Erasable, Programmable Read-Only Memory (EEPROM) bank 122 which stores user definable look-up tables. The CPU 110 is also coupled to a Random Access Memory (RAM) bank 124 which is used as scratchpad memory.

I/O port 112 is coupled to Operator Inputs 126, which come from the operator keyboard and control panel. Through Operator Inputs 126, an operator can specify desired X and Y inspection point coordinates, desired degrees of tilt, desired rotational position, and other parameters.

The I/O port 114 is coupled to Internal Sensor 128 which provides a variety of feedback signals concerning the internal states of the SEM. I/0 port 116 is coupled to Operator Displays 130 such as the operator CRT, plotters, and printers.

I/0 port 118 is coupled to a number of drivers 132, 134, 136, and 138 which are, in turn, coupled to step motors 64, 66, 68, and 70, respectively. The I/0 port 118 provides an x signal on a line 133 to driver 132 to cause the X step motor 64 to move the X carriage 16 the appropriate distance. Likewise, I/0 port 118 provides y, r, and t signals on lines 135, 137, and 139, respectively, to drivers 134, 136, and 138, respectively.

It should be noted that the control system for the step motors 64–70 is substantially open-loop since, during typical movements, there is no mechanical feedback of the shaft positions of the step motors. During these typical movements, such as a small rotational or tilt change, the extreme precision of the step motors 64–70 make such feedback unnecessary. There are, however, some mechanical feedback sensors (not shown) at predetermined locations in each of the motion directions to provide mechanical position feedback for calibration and zeroing purposes.

Referring now to the flowchart of FIG. 7a, the method steps for bringing an inspection point back into the viewing field after a non-eucentric rotation will be discussed. The rotation process starts at 140 with an operator request to rotate the inspection point by "r" degrees. At step 142, r is input into CPU 110 through I/0 port 112 and is temporarily stored in RAM 124. It should be noted that the current X and Y positions of the inspection point are already stored in RAM 124 due to previous process steps. Next, at step 143 the pedestal is caused to rotate by r degrees by actuating the R step motor 68. CPU 110 then, utilizing instruction steps stored in PROM 120, calculates the distance x that the X carriage 16 must move utilizing a first function $F_{x1}(r,X,Y)$, which is dependent upon the variables r, X, and Y stored in RAM 124. At method step 146, the CPU 110 outputs an x signal on line 133 to cause X step motor 64 to rotate its shaft the appropriate number of steps. Likewise, in method steps 148 and 150, the distance y that the Y carriage 18 must rotate is calculated using a function $F_{y1}(r,X,Y)$, and the Y carriage is appropriately moved by Y step motor 66. In steps 152 and 154, the values of R, X, and Y are updated and stored in RAM 124. The end of the rotate routine is indicated by the "RETURN" at step 156.

The flowchart of FIG. 7b illustrates the method steps for bringing an inspection point back into the viewing field after a non-eucentric tilt has been made. Steps 158–174 are analagous to steps 140–156 previously discussed with reference to a non-eucentric rotation. The method begins with an input from the operator of the change in tilt "t" desired at the inspection point. The T step motor 70 is then actuated to cause tilt frame 14 to move the desired amount (method step 161). The change in "y" during a tilt operation is dependent both upon the current tilt position T (which is stored in RAM 124) and upon the change in tilt t, and thus is determined by the relationship $y=F_{y1}(T,T+t)$. After the Y carriage 18 is moved by the distance -y, the change in "x" is calculated from the relationship $x=F_{x2}(T,T+t)$, since it also is dependent both upon T and t.

It should be noted that, for the current invention, $F_{x2}$ is simply an error function which returns very small values of x to correct for any mechanical imperfections in the assembly. This is because, in theory, only the Y carriage 18 needs to be adjusted to bring the inspection point back to the viewing field. Of course, in other embodiments of this invention where the tilt axis is not parallel to the X axis, the function $F_{x2}$ returns larger values of x.

As seen in method steps 170 and 172, X carriage 16 is then moved by the distance -x, and the new values for T, Y, and X are calculated and stored in RAM 124.

Of course, the method steps of FIGS. 7a and 7b are for illustrative purposes only, since there are many methods for calculating the x and y movements necessary to bring an inspection point back to the lens after a non-eucentric rotation or tilt. Furthermore, the order in which the x and y movements are made can be reversed, or even performed simultaneously. In very general term, the combined methods of FIGS. 7a and 7b reduce to: (1) The operator inputs the rotation or tilt to the computer; (2) The computer rotates or tilts the stage accordingly; (3) x and y correction factors are calculated; and (4) The computer moves the X carriage and Y carriage by the computed x and y correction factors.

While this invention has been described in terms of a few preferred embodiments, it is contemplated that persons reading the preceding descriptions and studying the drawing will realize various alterations, permutations and modifications thereof. It is therefore intended that the following appended claims be interpreted as including all such alterations, permutations and modifications as fall within the true spirit and scope of the present invention.

What is claimed is:

1. A stage assembly and controller comprising:
   a support frame having a substantially horizontal base member and a pair of spaced legs substantially perpendicular to said base member;
   a tilt frame pivotally coupled between the spaced legs of said support frame for rotational movement around a tilt axis, said tilt frame supporting a first linear guide means parallel with said tilt axis;
   a first carriage engaged with said first linear guide means for bidirectional linear movement parallel with said tilt axis, said first carriage supporting a second linear guide means substantially perpendicular to said first linear guide means;
   a second carriage engaged with said second guide means for bidirectional linear movement, the combined movements of said first carriage and said second carriage permitting said second carriage to make Cartesian movements in a tilt plane determined by said tilt frame;

a pedestal coupled to said second carriage for concurrent Cartesian movements in said tilt plane, said pedestal having a specimen support surface parallel with said tilt plane and rotatable on an axis substantially normal to said tilt plane; and control means for controlling the rotation of said tilt frame, said linear movement of said first carriage, said linear movement of said second carriage, and said rotation of said pedestal.

2. A stage assembly and controller as recited in claim 1 wherein said control means includes:

tilt motive means coupled between said support frame and said tilt frame, said tilt motive means being responsive to a tilt signal and being operative to produce said tilting movement;

first carriage motive means coupled between said tilt frame and said first carriage, said first carriage motive means being responsive to a first carriage motive signal and being operative to produce said linear movement of said first carriage;

second carriage motive means coupled between said first carriage and said second carriage, said second carriage motive means being responsive to a second carriage motive signal and being operative to produce said linear movement of said second carriage; and pedestal motive means coupled between said second carriage and said pedestal, said pedestal motive means being responsive to a pedestal motive signal and being operative produce said rotation of said pedestal.

3. A stage assembly and controller as recited in claim 2 wherein said tilt motive means includes a tilt motor, said first carriage motive means includes a first carriage motor, said second carriage motive means includes a second carriage motor, and said pedestal motive means includes a pedestal motor, where each of said motors is individually responsive to said control means.

4. A stage assembly and controller as recited in claim 3 wherein said first carriage motive means further comprises a first drive screw engaged with a threaded bore provided in said first carriage and rotated by said first carriage motor along an axis parallel to said first linear guide means, and wherein said second carriage motive means further comprises a second drive screw engaged with a threaded bore provided in said second carriage and rotated by said second carriage motor along an axis parallel to said second linear guide means.

5. A stage assembly and controller as recited in claim 3 wherein said pedestal motor directly rotates said pedestal, and wherein the shaft of said tilt frame motor is coupled to said tilt frame by a gear assembly.

6. A stage assembly and controller as recited in claim 2 wherein said control means further includes operator input means, internal sensing means, and processing means responsive to said operator input means and said internal sensing means and operative to develop said tilt signal, said first carriage motive signal, said second carriage motive signal, and said pedestal motive signal.

7. A stage assembly and controller as recited in claim 6 wherein said processing means includes a digital central processing unit, memory means coupled to said central processing unit, input/output means coupled to said central processing unit that is responsive said operator input means, input/output means coupled to said central processing unit that is responsive to said internal sensing means, an input/output coupled to said central processing unit is operative to develop said tilt signal, said first carriage motive signal, said second carriage motive signal, and said pedestal motive signal.

* * * * *